(12) United States Patent
Hirano et al.

(10) Patent No.: US 10,534,262 B2
(45) Date of Patent: Jan. 14, 2020

(54) CHEMICALLY AMPLIFIED POSITIVE RESIST COMPOSITION AND PATTERNING PROCESS

(71) Applicant: SHIN-ETSU CHEMICAL CO., LTD., Tokyo (JP)

(72) Inventors: Yoshinori Hirano, Annaka (JP); Hideyoshi Yanagisawa, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 3 days.

(21) Appl. No.: 15/334,660

(22) Filed: Oct. 26, 2016

(65) Prior Publication Data
US 2017/0115567 A1    Apr. 27, 2017

(30) Foreign Application Priority Data
Oct. 27, 2015  (JP) ................. 2015-210328

(51) Int. Cl.
| | | |
|---|---|---|
| *G03F 7/004* | (2006.01) | |
| *G03F 7/40* | (2006.01) | |
| *G03F 7/039* | (2006.01) | |
| *G06F 7/40* | (2006.01) | |
| *G03F 7/16* | (2006.01) | |
| *G03F 7/20* | (2006.01) | |
| *G03F 7/32* | (2006.01) | |

(52) U.S. Cl.
CPC .......... *G03F 7/0397* (2013.01); *G03F 7/0045* (2013.01); *G03F 7/0392* (2013.01); *G03F 7/162* (2013.01); *G03F 7/168* (2013.01); *G03F 7/2004* (2013.01); *G03F 7/322* (2013.01); *G06F 7/40* (2013.01)

(58) Field of Classification Search
CPC .......... G03F 7/0392; G03F 7/40; G03F 7/0397
USPC ............... 430/270.1, 326, 905, 910
See application file for complete search history.

(56) References Cited

U.S. PATENT DOCUMENTS

| | | | | |
|---|---|---|---|---|
| 4,603,101 A | * | 7/1986 | Crivello | C08F 12/22 430/270.1 |
| 5,352,564 A | * | 10/1994 | Takeda | G03F 7/039 430/270.1 |
| 5,736,296 A | * | 4/1998 | Sato | G03F 7/0045 430/170 |
| 5,750,309 A | * | 5/1998 | Hatakeyama | G03F 7/0045 430/170 |
| 5,817,444 A | * | 10/1998 | Sato | G03F 7/0045 430/155 |
| 5,972,559 A | * | 10/1999 | Watanabe | G03F 7/0045 430/270.1 |
| 8,968,982 B2 | | 3/2015 | Yasuda et al. | |
| 9,436,084 B2 | | 9/2016 | Misumi et al. | |
| 2005/0019691 A1 | | 1/2005 | Tseng et al. | |
| 2012/0003583 A1 | * | 1/2012 | Tsuchimura | G03F 7/0045 430/283.1 |
| 2012/0184101 A1 | | 7/2012 | Yasuda et al. | |
| 2012/0220112 A1 | | 8/2012 | Hatakeyama et al. | |
| 2014/0065545 A1 | | 3/2014 | Hatakeyama et al. | |
| 2016/0306278 A1 | * | 10/2016 | Yonemura | G03F 7/039 |

FOREIGN PATENT DOCUMENTS

| | | | |
|---|---|---|---|
| EP | 2 360 527 A1 | | 8/2011 |
| JP | 0262544 | * | 3/1990 |
| JP | 11-72928 A | | 3/1999 |
| JP | 2006-267475 A | | 10/2006 |
| JP | 2012-163950 A | | 8/2012 |

OTHER PUBLICATIONS

Extended European Search Report dated Mar. 20, 2017, issued in counterpart European Application No. 16195476.3. (8 pages).
European Search Report dated Oct. 16, 2017 issued in counterpart application No. 16195476.3. (8 pages).
Office Action dated Aug. 28, 2018, issued in counterpart Japanese Application No. 2015-210328, with English machine translation. (6 pages).

* cited by examiner

*Primary Examiner* — John S Chu
(74) *Attorney, Agent, or Firm* — Westerman, Hattori, Daniels & Adrian, LLP

(57) ABSTRACT

A chemically amplified positive resist composition is provided comprising a specific alkali-soluble polymer adapted to turn soluble in alkaline aqueous solution under the action of acid as base resin, an alkali-soluble polymer, and a photoacid generator in an organic solvent. The composition forms a resist film which can be briefly developed to form a pattern at a high sensitivity without generating dimples in pattern sidewalls.

8 Claims, No Drawings

CHEMICALLY AMPLIFIED POSITIVE RESIST COMPOSITION AND PATTERNING PROCESS

CROSS-REFERENCE TO RELATED APPLICATION

This non-provisional application claims priority under 35 U.S.C. § 119(a) on Patent Application No. 2015-210328 filed in Japan on Oct. 27, 2015, the entire contents of which are hereby incorporated by reference.

TECHNICAL FIELD

This invention relates to a chemically amplified positive resist composition and a pattern forming process.

BACKGROUND ART

In harmony with the downsizing of electronic equipment, a rapid progress is recently made toward higher integration of LSIs. For LSI mounting, multi-pin thin-film packaging of flip-chip type or the like is employed. To construct such multi-pin structures, the technology for forming bump electrodes of 10 to 100 μm or higher as the connecting terminal is necessary. While a thick resist film is used in forming bump electrodes, it is required that the resist film have a higher sensitivity and be developed in a shorter time. To meet such requirements, Patent Document 1 proposes to add an alkali-soluble resin comprising hydroxystyrene units to a chemically amplified positive resist composition.

Typically, the chemically amplified positive resist composition contains a normally alkali-insoluble polymer adapted to increase its solubility in alkaline aqueous solution under the action of acid as a base resin. When an alkali-soluble resin is added thereto, it is important that there is no substantial difference between the dissolution rate of the normally alkali-insoluble polymer which has turned alkali soluble and the dissolution rate of the alkali-soluble resin. For example, when an alkali-soluble resin comprising hydroxystyrene units having an inadequate dissolution rate is added to the chemically amplified positive resist composition described in Patent Document 2, small pocks known as "dimples" are generated in pattern sidewalls due to a substantial difference of alkaline dissolution rate between the base resin and the alkali-soluble resin.

CITATION LIST

Patent Document 1: JP-A 2006-267475
Patent Document 2: JP-A 2012-163950

SUMMARY OF INVENTION

An object of the invention is to provide a chemically amplified positive resist composition which can form a pattern at a high sensitivity and within a short development time without generating dimples in pattern sidewalls; and a pattern forming process using the same.

The inventors have found that the above and other objects are attained by combining a specific base resin having the formula (1) shown below with an alkali-soluble resin.

In one aspect, the invention provides a chemically amplified positive resist composition comprising (A) a polymer adapted to turn soluble in alkaline aqueous solution under the action of acid, comprising recurring units having the general formula (1), and having a weight average molecular weight of 1,000 to 500,000,

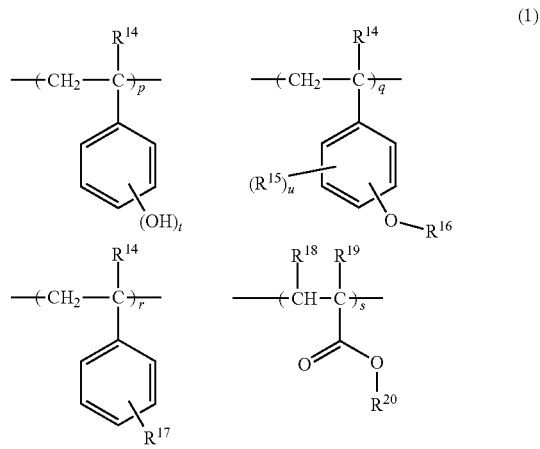

wherein $R^{14}$ is hydrogen, hydroxyl, straight alkyl, branched alkyl, halogen, or trifluoromethyl, $R^{15}$ is hydrogen, hydroxyl, halogen or trifluoromethyl, $R^{16}$ is $C_4$-$C_{12}$ tertiary alkyl, $R^{17}$ is hydrogen, optionally substituted alkyl, optionally substituted alkoxy, —$C(CF_3)_2$—OH, trialkylsilyl in which each alkyl moiety has 1 to 6 carbon atoms, $C_4$-$C_{20}$ oxoalkoxy, tetrahydropyranyloxy, tetrahydrofuranyloxy, or trialkylsilyl, $R^{18}$ is hydrogen or methyl, $R^{19}$ is hydrogen, methyl, alkoxycarbonyl, cyano, halogen, or trifluoromethyl, $R^{20}$ is a $C_4$-$C_{30}$ substituted or unsubstituted, straight or branched alkyl group or substituted or unsubstituted cycloalkyl group, u is 0 or an integer of 1 to 4, t is 0 or an integer of 1 to 5, p, r and s are 0 or positive numbers, q is a positive number, p+q+r+s=1, (B) an alkali-soluble polymer containing a hydroxyl and/or carboxyl group and having a weight average molecular weight of 1,000 to 100,000, the polymer being soluble in an alkaline aqueous solution and having an alkaline dissolution rate of 400 to 12,000 angstrom/sec (Å/sec) in 2.38 wt % tetramethylammonium hydroxide aqueous solution, (C) a photoacid generator, and (D) an organic solvent.

In a preferred embodiment, the alkali-soluble polymer (B) is selected from the group consisting of phenolic resin, urethane resin, polyhydroxystyrene, a copolymer of hydroxystyrene and a carboxyl-containing vinyl monomer, a homopolymer or copolymer of a carboxyl-containing monomer, a copolymer of hydroxystyrene and a carboxyl-containing monomer, and an alkali-soluble cellulose.

In formula (1), p and q are preferably in the range: 0.3≤p/(p+q+r+s)≤0.8 and 0<q/(p+q+r+s)≤0.5. Also preferably, p, q and s are in the range: 0.3≤p/(p+q+r+s)≤0.8, 0<q/(p+q+r+s)≤0.5, and 0<s/(p+q+r+s)<0.3.

In formula (1), preferably $R^{20}$ is a group selected from the following formulae (4), (5), (6'), (6''), (6''') and (6''''):

wherein $R^{27}$ is methyl, ethyl, isopropyl, cyclohexyl, cyclopentyl, vinyl, acetyl, phenyl, benzyl or cyano, b is an integer of 0 to 3,

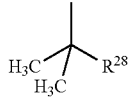
(5)

wherein $R^{28}$ is methyl, ethyl, isopropyl, cyclohexyl, cyclopentyl, vinyl, phenyl, benzyl or cyano,

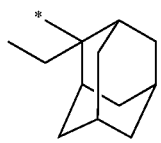
(6')

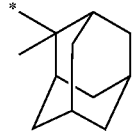
(6'')

(6''')

(6'''')

wherein * denotes a valence bond.

In another aspect, the invention provides a pattern forming process comprising the steps of (i) coating the chemically amplified positive resist composition defined above onto a substrate and prebaking to form a resist film, (ii) exposing the resist film to UV radiation having a wavelength of at least 300 nm, and (iii) optionally baking, and developing the resist film in an alkaline aqueous solution.

ADVANTAGEOUS EFFECTS OF INVENTION

The chemically amplified positive resist composition can form a pattern at a high sensitivity and within a short development time without generating dimples in pattern sidewalls.

DESCRIPTION OF EMBODIMENTS

The terms "a" and "an" herein do not denote a limitation of quantity, but rather denote the presence of at least one of the referenced item. "Optional" or "optionally" means that the subsequently described event or circumstance may or may not occur, and that the description includes instances where the event occurs and instances where it does not. As used herein, the notation ($C_n$-$C_m$) means a group containing from n to m carbon atoms per group.

The abbreviations and acronyms have the following meaning.

Mw: weight average molecular weight

Mn: number average molecular weight

Mw/Mn: molecular weight distribution or dispersity

GPC: gel permeation chromatography

PEB: post-exposure baking

TMAH: tetramethylammonium hydroxide

It is noted that Mw is measured by GPC versus polystyrene standards. The "alkali-soluble polymer" means a polymer which is soluble in an alkaline aqueous solution, typically 2.38 wt % TMAH aqueous solution.

Briefly stated, one embodiment of the invention is a chemically amplified positive resist composition comprising (A) a specific polymer, (B) an alkali-soluble polymer, (C) a photoacid generator, and (D) an organic solvent.

Component (A) is a polymer adapted to turn soluble in alkaline aqueous solution under the action of acid, the polymer comprising recurring units having the general formula (1) and having a Mw of 1,000 to 500,000.

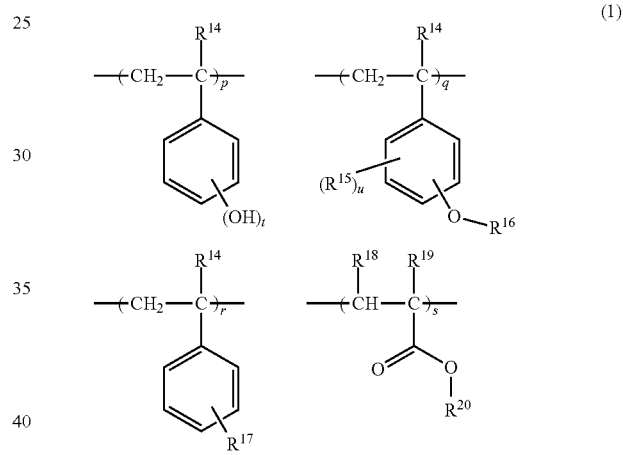
(1)

Herein $R^{14}$ is hydrogen, hydroxyl, $C_1$-$C_6$ straight alkyl, $C_3$-$C_6$ branched alkyl, halogen, or trifluoromethyl, $R^{15}$ is hydrogen, hydroxyl, halogen or trifluoromethyl, $R^{16}$ is $C_4$-$C_{12}$ tertiary alkyl, $R^{17}$ is hydrogen, a $C_1$-$C_{12}$ optionally fluoro-substituted alkyl group, $C_1$-$C_{12}$ optionally fluoro-substituted alkoxy group, —C(CF$_3$)$_2$—OH, trialkylsilyl group in which each alkyl moiety has 1 to 6 carbon atoms, $C_4$-$C_{20}$ oxoalkoxy group, tetrahydropyranyloxy group, tetrahydrofuranyloxy group, or trialkylsilyl group, $R^{18}$ is hydrogen or methyl, $R^{19}$ is hydrogen, methyl, alkoxycarbonyl, cyano, halogen, or trifluoromethyl, $R^{20}$ is a $C_4$-$C_{30}$ substituted or unsubstituted, straight or branched alkyl group or substituted or unsubstituted cycloalkyl group, u is 0 or an integer of 1 to 4, t is 0 or an integer of 1 to 5, p, r and s each are 0 or a positive number, q is a positive number, p+q+r+s=1.

When the optionally substituted alkoxy group represented by $R^{17}$ has an acid labile group function, it is selected from a variety of such groups, preferably from a group of the following formula (2), a group of the following formula (3), and a straight, branched or cyclic $C_4$-$C_{20}$ tertiary alkoxy group. When $R^{17}$ is a tertiary alkoxy group, it is an alkoxy group excluding the tertiary alkyl group selected for $R^{16}$.

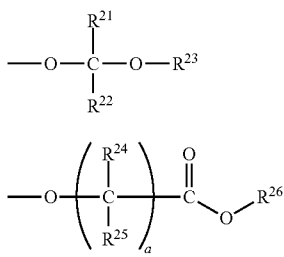

(2)

(3)

Herein $R^{21}$, $R^{22}$, $R^{23}$, $R^{24}$, and $R^{25}$ are each independently hydrogen, or a straight or branched $C_1$-$C_8$ alkyl group, a pair of $R^{21}$ and $R^{22}$, $R^{21}$ and $R^{23}$, or $R^{22}$ and $R^{23}$ may bond together to form a ring with the carbon atom or the carbon and oxygen atoms to which they are attached, each participant of $R^{21}$, $R^{22}$, and $R^{23}$ is a straight or branched $C_1$-$C_{18}$ alkylene group when they form a ring. $R^{26}$ is a straight, branched or cyclic $C_4$-$C_{40}$ alkyl group, and "a" is 0 or an integer of 1 to 4.

Suitable acid labile groups of formula (2) include methoxyethyloxy, ethoxyethyloxy, n-propoxyethyloxy, isopropoxyethyloxy, n-butoxyethyloxy, isobutoxyethyloxy, t-butoxyethyloxy, cyclohexyloxyethyloxy, methoxypropyloxy, ethoxypropyloxy, 1-methoxy-1-methylethyloxy, and 1-ethoxy-1-methylethyloxy. Suitable acid labile groups of formula (3) include t-butoxycarbonyloxy, t-butoxycarbonylmethyloxy, ethylcyclopentyloxycarbonyloxy, ethylcyclohexyloxycarbonyloxy, and methylcyclopentyloxycarbonyloxy, to be bonded to the pendant benzene ring in formula (1). Suitable trialkylsilyl groups include those in which each alkyl moiety has 1 to 6 carbon atoms, such as trimethylsilyl.

In formula (1), $R^{14}$, $R^{15}$ and $R^{19}$ may be halogen. Exemplary halogens are fluorine, chlorine and bromine.

$R^{20}$ is an alkyl group which may be tertiary alkyl. Tertiary alkyl may be selected from optionally substituted alkyl groups of 4 to 30 carbon atoms, preferably those of the general formulae (4) and (5).

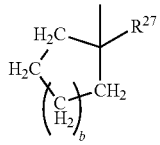

(4)

Herein $R^{27}$ is methyl, ethyl, isopropyl, cyclohexyl, cyclopentyl, vinyl, acetyl, phenyl, benzyl or cyano, and b is an integer of 0 to 3.

The cyclic alkyl groups of formula (4) are preferably 5- or 6-membered rings. Examples include 1-methylcyclopentyl, 1-ethylcyclopentyl, 1-isopropylcyclopentyl, 1-vinylcyclopentyl, 1-acetylcyclopentyl, 1-phenylcyclopentyl, 1-cyanocyclopentyl, 1-methylcyclohexyl, 1-ethylcyclohexyl, 1-isopropylcyclohexyl, 1-vinylcyclohexyl, 1-acetylcyclohexyl, 1-phenylcyclohexyl, and 1-cyanocyclohexyl.

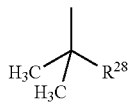

(5)

Herein $R^{28}$ is methyl, ethyl, isopropyl, cyclohexyl, cyclopentyl, vinyl, phenyl, benzyl or cyano.

Examples of the group of formula (5) include t-butyl, 1-vinyldimethylmethyl, 1-benzyldimethylmethyl, 1-phenyldimethylmethyl, and 1-cyanodimethylmethyl.

An alkyl group forming a tertiary ester as shown below is also preferred as $R^{20}$.

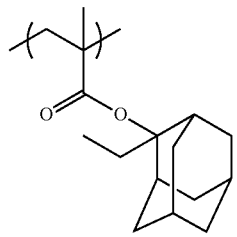

(6)-1

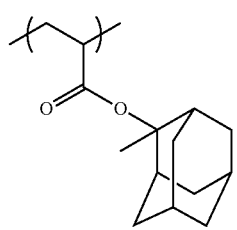

(6)-2

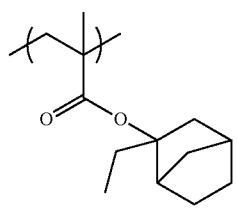

(6)-3

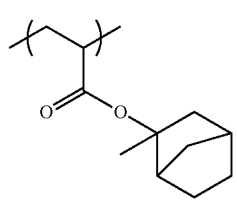

(6)-4

In formula (1), p, r and s each are 0 or a positive number, and q is a positive number. With properties of the resist composition taken into account, these subscripts preferably satisfy the following range:

$0<q/(p+q+r+s)\leq 0.5$, more preferably $0<q/(p+q+r+s)\leq 0.3$,
$0\leq p/(p+q+r+s)\leq 0.8$, more preferably $0.3\leq p/(p+q+r+s)\leq 0.8$,
$0\leq r/(p+q+r+s)\leq 0.35$, with the proviso that $r>0$ when the polymer consists of four components,
$0\leq s/(p+q+r+s)\leq 0.35$, more preferably $0<s/(p+q+r+s)<0.3$, provided $p+q+r+s=1$.

In case q=0, indicating that a polymer of formula (1) does not contain the relevant unit (q), a contrast of alkaline dissolution rate is lost, and resolution is worsened. If a proportion of p is too high, the unexposed region of film may have too high an alkaline dissolution rate. By properly selecting the values of p, q, r and s within the above ranges, the size and profile of a pattern can be controlled as desired.

In order that the chemically amplified positive resist composition have a high sensitivity and be developable in a short time, it is preferred that s in formula (1) be not equal to 0. In a case where a phenolic hydroxyl group is protected with an acid labile group, the alkali soluble lo functional group resulting from elimination of that acid labile group is the phenolic hydroxyl group. On the other hand, the substituent group $R^{20}$ in recurring unit (s) is a tertiary alkyl group which is an acid labile group, and the alkali soluble functional group resulting from elimination of $R^{20}$ is —COOH group. When the dissolution rate of phenolic hydroxyl group and —COOH group in alkaline developer is compared, the dissolution rate of —COOH group is overwhelmingly high. Then the chemically amplified positive resist composition comprising a base resin containing recurring units (s) has a high sensitivity and is developable in a short time.

The polymer of formula (1) should have a Mw of 1,000 to 500,000, preferably 2,000 to 300,000. With too low a Mw, the resist composition is less heat resistant. With too high a Mw, the resist composition is reduced in alkali dissolution and tends to a footing phenomenon after pattern formation.

Component (B) is an alkali-soluble polymer containing a hydroxyl and/or carboxyl group and having a Mw of 1,000 to 100,000, preferably 2,000 to 50,000, the alkali-soluble polymer being soluble in an alkaline aqueous solution and having an alkaline dissolution rate of 400 to 12,000 Å/sec in 2.38 wt % TMAH aqueous solution. Preferably the alkali-soluble polymer is selected from among phenolic resin, urethane resin, polyhydroxystyrene, a polymer obtained from copolymerization of hydroxystyrene with a carbonyl-containing vinyl monomer, a polymer obtained from polymerization or copolymerization of a carboxyl-containing monomer (e.g., acrylic acid, methacrylic acid, (meth)acrylate and maleic acid), a polymer obtained from copolymerization of hydroxystyrene with a carboxyl-containing monomer (e.g., acrylic acid, methacrylic acid, (meth)acrylate and maleic acid), and alkali-soluble cellulose, provided that all these polymers are soluble in alkaline aqueous solution and have an alkaline dissolution rate of 400 to 12,000 Å/sec, preferably 1,000 to 12,000 Å/sec in 2.38 wt % TMAH aqueous solution. Among these, preference is given to novolak resins which are obtained from reaction of phenols (e.g., phenol, o-cresol, m-cresol, p-cresol, o-ethylphenol, m-ethylphenol, 2,3-xylenol, and 2,5-xylenol) with aldehydes (e.g., formaldehyde, benzaldehyde and acetaldehyde) in the presence of acid catalysts (e.g., hydrochloric acid, formic acid and oxalic acid) because of availability and low cost.

The alkaline dissolution rate of the relevant polymer may be determined by any standard methods. For example, the polymer is dissolved in an organic solvent and optionally passed through a filter. The solution is coated on a substrate by means of a spin coater or the like, and prebaked to remove the organic solvent. The organic film on the substrate is measured for thickness by a thickness gauge. The film is then developed in an alkaline aqueous solution, i.e., 2.38 wt % TMAH solution for a predetermined time and thereafter, measured again for thickness by the thickness gauge. The difference between film thickness before development and film thickness after development is divided by the development time to determine an alkaline dissolution rate.

If the dissolution rate of the alkali-soluble polymer is too high, pocks known as dimples generate in sidewalls after development due to a difference in dissolution rate between that polymer (B) and the base resin (A). If the dissolution rate of the alkali-soluble polymer is too low, development takes a longer time, which may be disadvantageous in developing thick-film material.

The alkali-soluble polymer containing a hydroxyl and/or carboxyl group and having a Mr of 1,000 to 100,000 is preferably used in an amount of 3 to 35 parts, more preferably 5 to 25 parts by weight per 100 parts by weight of the polymer of formula (1). If the amount of the alkali-soluble polymer exceeds 35 parts, undesirably there may occur a so-called film loss phenomenon that even the unexposed region of film is dissolved during development.

Component (C) is a photoacid generator (PAG) which may be any compound capable of generating an acid upon exposure to high-energy radiation. Suitable PAGs include sulfonium salt, iodonium salt, sulfonyldiazomethane, and N-sulfonyloxyimide acid generators. Exemplary acid generators are given below while they may be used alone or in admixture of two or more. Sulfonium salts are salts of sulfonium cations with sulfonates. Exemplary sulfonium cations include triphenylsulfonium, (4-t-butoxyphenyl)diphenylsulfonium, bis(4-t-butoxyphenyl)phenylsulfonium, tris(4-t-butoxyphenyl)sulfonium, (3-t-butoxyphenyl)diphenylsulfonium, bis(3-t-butoxyphenyl)phenylsulfonium, tris(3-t-butoxyphenyl)sulfonium, (3,4-di-t-butoxyphenyl)diphenylsulfonium, bis(3,4-di-t-butoxyphenyl)phenylsulfonium, tris(3,4-di-t-butoxyphenyl)sulfonium, diphenyl(4-thlophenoxyphenyl)sulfonium, (4-t-butoxycarbonylmethyloxyphenyl)diphenylsulfonium, tris(4-t-butoxycarbonylmethyloxyphenyl)sulfonium, (4-t-butoxyphenyl)bis(4-dimethylaminophenyl)sulfonium, tris(4-dimethylaminophenyl)sulfonium, 2-naphthyldiphenylsulfonium, dimethyl(2-naphthyl)sulfonium, 4-hydroxyphenyldimethylsulfonium, 4-methoxyphenyldimethylsulfonium, trimethylsulfonium, 2- oxocyclohexylcyclohexylmethylsulfonium, trinaphthylsulfonium, and tribenzylsulfonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-(trifluoromethyl)benzenesulfonate, 4-fluorobenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodonium salts are salts of iodonium cations with sulfonates. Exemplary iodonium cations include aryl iodonium cations such as diphenyliodonium, bis(4-t-butylphenyl)iodonium, 4-t-butoxyphenylphenyliodonium, and 4-methoxyphenylphenyliodonium.

Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-(trifluoromethyl)benzenesulfonate, 4-fluorobenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bissulfonyldiazomethane compounds and sulfonyl-carbonyldiazomethane compounds such as
bis(ethylsulfonyl)diazomethane,
bis(1-methylpropylsulfonyl)diazomethane,
bis(2-methylpropylsulfonyl)diazomethane,
bis(1,1-dimethylethylsulfonyl)diazomethane,
bis(cyclohexylsulfonyl)diazomethane,
bis(perfluoroisopropylsulfonyl)diazomethane,
bis(phenylsulfonyl)diazomethane, bis(4-methylphenylsulfonyl)diazomethane,
bis(2,4-dimethylphenylsulfonyl)diazomethane,
bis(2-naphthylsulfonyl)diazomethane,
4-methylphenylsulfonylbenzoyldiazomethane,
t-butylcarbonyl-4-methylphenylsulfonyldiazomethane,
2-naphthylsulfonylbenzoyldiazomethane,
4-methylphenylsulfonyl-2-naphthoyldiazomethane,
methylsulfonylbenzoyldiazomethane, and
t-butoxycarbonyl-4-methylphenylsulfonyldiazomethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Benzoinsulfonate photoacid generators include benzoin tosylate, benzoin mesylate, and benzoin butanesulfonate.

Pyrogallol trisulfonate photoacid generators include pyrogallol, phloroglucinol, catechol, resorcinol, and hydroquinone, in which all hydroxyl groups are substituted with trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, or methanesulfonate.

Nitrobenzyl sulfonate photoacid generators include 2,4-dinitrobenzyl sulfonates, 2-nitrobenzyl sulfonates, and 2,6-dinitrobenzyl sulfonates, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is substituted by trifluoromethyl.

Sulfone photoacid generators include
bis(phenylsulfonyl)methane,
bis(4-methylphenylsulfonyl)methane,
bis(2-naphthylsulfonyl)methane,
2,2-bis(phenylsulfonyl)propane,
2,2-bis(4-methylphenylsulfonyl)propane,
2,2-bis(2-naphthylsulfonyl)propane,
2-methyl-2-(p-toluenesulfonyl)propiophenone,
2-cyclohexylcarbonyl-2-(p-toluenesulfonyl)propane, and
2,4-dimethyl-2-(p-toluenesulfonyl)pentan-3-one.

Suitable O-arylsulfonyloxime compounds and O-alkylsulfonyloxime compounds (oxime sulfonates) include photoacid generators in the form of glyoxime derivatives; photoacid generators in the form of oxime sulfonates with a long conjugated system separated by thiophene or cyclohexadiene; oxime sulfonates having an electron withdrawing group such as trifluoromethyl incorporated for increased stability; oxime sulfonates using phenylacetonitrile or substituted acetonitrile derivatives; and bisoxime sulfonates.

Glyoxime derivative photoacid generators include
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedionedioxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(methanesulfonyl)-α-dimethylglyoxime,
bis-O-(trifluoromethanesulfonyl)-α-dimethylglyoxime,
bis-O-(2,2,2-trifluoroethanesulfonyl)-α-dimethylglyoxime,
bis-O-(10-camphorsulfonyl)-α-dimethylglyoxime,
bis-O-(benzenesulfonyl)-α-dimethylglyoxime,
bis-O-(4-trifluoromethylbenzenesulfonyl)-α-dimethylglyoxime,
bis-O-(xylenesulfonyl)-α-dimethylglyoxime,
bis-O-(trifluoromethanesulfonyl)-nioxime,
bis-O-(2,2,2-trifluoroethanesulfonyl)-nioxime,
bis-O-(10-camphorsulfonyl)-nioxime,
bis-O-(benzenesulfonyl)-nioxime,
bis-O-(4-fluorobenzenesulfonyl)-nioxime,
bis-O-(4-(trifluoromethyl)benzenesulfonyl)-nioxime, and
bis-O-(xylenesulfonyl)-nioxime.

Also included are modified forms of the foregoing compounds having substituted on their skeleton
2-benzoyloxy-1,1,3,3,3-pentafluoropropanesulfonate,
1,1,3,3,3-pentafluoro-2-(4-phenylbenzoyloxy)propanesulfonate,
1,1,3,3,3-pentafluoro-2-pivaloyloxypropanesulfonate,
2-cyclohexanecarbonyloxy-1,1,3,3,3-pentafluoropropanesulfonate,
1,1,3,3,3-pentafluoro-2-furoyloxypropanesulfonate,
2-naphthoyloxy-1,1,3,3,3-pentafluoropropanesulfonate,
2-(4-t-butylbenioyloxy)-1,1,3,3,3-pentafluoropropanesulfonate,
2-(1-adamantanecarbonyloxy)-1,1,3,3,3-pentafluoropropane-sulfonate,
2-acetyloxy-1,1,3,3,3-pentafluoropropanesulfonate,
1,1,3,3,3-pentafluoro-2-hydroxypropanesulfonate,
1,1,3,3,3-pentafluoro-2-tosyloxypropanesulfonate,
1,1-difluoro-2-tosyloxyethanesulfonate,
adamantanemethoxycarbonyldifluoromethanesulfonate,
1-(3-hydroxymethyladamantane)methoxycarbonyldifluoromethane-sulfonate,
methoxycarbonyldifluoromethanesulfonate,
1-(hexahydro-2-oxo-3,5-methano-2H-cyclopenta[b]furan-6-yl-oxycarbonyl)difluoromethanesulfonate, and
4-oxo-1-adamantyloxycarbonyldifluoromethanesulfonate.

Photoacid generators in the form of oxime sulfonates with a long conjugated system separated by thiophene or cyclohexadiene include
(5-(p-toluenesulfonyl)oxyimino-5H-thiophen-2-ylidene)-phenylacetonitrile,
(5-(10-camphorsulfonyl)oxylmino-5H-thiophen-2-ylidene)-phenylacetonitrile,
(5-n-octanesulfonyloxyimino-5H-thiophen-2-ylidene)-phenylacetonitrile,
(5-(p-toluenesulfonyl)oxyimino-5H-thiophen-2-ylidene)(2-methylphenyl)acetonitrile,
(5-(10-camphorsulfonyl)oxyimino-5H-thiophen-2-ylidene)(2-methylphenyl)acetonitrile,
(5-n-octanesulfonyloxyimino-5H-thiophen-2-ylidene)(2-methylphenyl)acetonitrile,
(5-(4-(p-toluenesulfonyloxy)benzenesulfonyl)oxyimino-5H-thlophen-2-ylidene)phenylacetonitrile, and
(5-(2,5-bis(p-toluenesulfonyloxy)benzenesulfonyl)oxyimino-5H-thiophen-2-ylidene)phenylacetonitrile.

Also included are modified forms of the foregoing compounds having substituted on their skeleton 2-benzoyloxy-1,1,3,3,3-pentafluoropropanesulfonate,
1,1,3,3,3-pentafluoro-2-(4-phenylbenzoyloxy)propanesulfonate,
1,1,3,3,3-pentafluoro-2-pivaloyloxypropanesulfonate,
2-cyclohexanecarbonyloxy-1,1,3,3,3-pentafluoropropanesulfonate,
1,1,3,3,3-pentafluoro-2-furoyloxypropanesulfonate,
2-naphthoyloxy-1,1,3,3,3-pentafluoropropanesulfonate,
2-(4-t-butylbenzoyloxy)-1,1,3,3,3-pentafluoropropanesulfonate,
2-(1-adamantanecarbonyloxy)-1,1,3,3,3-pentafluoropropane-sulfonate,
2-acetyloxy-1,1,3,3,3-pentafluoropropanesulfonate,
1,1,3,3,3-pentafluoro-2-hydroxypropanesulfonate,
1,1,3,3,3-pentafluoro-2-tosyloxypropanesulfonate,
1,1-difluoro-2-tosyloxyethanesulfonate,
adamantanemethoxycarbonyldifluoromethanesulfonate,
1-(3-hydroxymethyladamantane)methoxycarbonyldifluoromethane-sulfonate,
methoxycarbonyldifluoromethanesulfonate,
1-(hexahydro-2-oxo-3,5-methano-2H-cyclopenta[b]furan-6-yl-oxycarbonyl) difluoromethanesulfonate, and
4-oxo-1-adamantyloxycarbonyldifluoromethanesulfonate.

Suitable oxime sulfonates having an electron withdrawing group such as trifluoromethyl incorporated for increased stability include
2,2,2-trifluoro-1-phenyl-ethanone O-(methylsulfonyl)oxime,
2,2,2-trifluoro-1-phenyl-ethanone O-(10-camphorsulfonyl)oxime,
2,2,2-trifluoro-1-phenylethanone O-(4-methoxybenzenesulfonyl)oxime,
2,2,2-trifluoro-1-phenylethanone O-(1-naphthylsulfonyl)oxime,
2,2,2-trifluoro-1-phenylethanone O-(2-naphthylsulfonyl)oxime,
2,2,2-trifluoro-1-phenylethanone O-(2,4,6-trimethylphenylsulfonyl)oxime,
2,2,2-trifluoro-1-(4-methylphenyl)ethanone O-(10-camphorsulfonyl)oxime,
2,2,2-trifluoro-1-(4-methylphenyl)ethanone O-(methylsulfonyl)oxime,
2,2,2-trifluoro-1-(2-methylphenyl)ethanone O-(10-camphorsulfonyl)oxime,
2,2,2-trifluoro-1-(2,4-dimethylphenyl)ethanone O-(10-camphorsulfonyl)oxime,
2,2,2-trifluoro-1-(2,4-dimethylphenyl)ethanone O-(1-naphthylsulfonyl)oxime,
2,2,2-trifluoro-1-(2,4-dimethylphenyl)-ethanone O-(2-naphthylsulfonyl)oxime,
2,2,2-trifluoro-1-(2,4,6-trimethylphenyl)ethanone O-(10-camphorsulfonyl)oxime,
2,2,2-trifluoro-1-(2,4,6-trimethylphenyl)ethanone O-(1-naphthylsulfonyl)oxime,
2,2,2-trifluoro-1-(2,4,6-trimethylphenyl)ethanone O-(2-naphthylsulfonyl)oxime,
2,2,2-trifluoro-1-(4-methoxyphenyl)ethanone O-(methylsulfonyl)oxime,
2,2,2-trifluoro-1-(4-methylthiophenyl)-ethanone O-(methylsulfonyl)oxime,
2,2,2-trifluoro-1-(3,4-dimethoxyphenyl)ethanone O-(methylsulfonyl)oxime,
2,2,2-trifluoro-1-(4-methoxyphenyl)ethanone O-(4-methylphanylsulfonyl)oxime,
2,2,2-trifluoro-1-(4-methoxyphenyl)ethanone O-(4-methoxyphenylsulfonyl)oxime,
2,2,2-trifluoro-1-(4-methoxyphenyl)ethanone O-(4-dodecylphenylsulfonyl)oxime,
2,2,2-trifluoro-1-(4-methoxyphenyl)ethanone O-(octylsulfonyl)oxime,
2,2,2-trifluoro-1-(4-thiomethylphenyl)ethanone O-(4-methoxyphenylsulfonyl)oxime,
2,2,2-trifluoro-1-(4-thiomethylphenyl)ethanone O-(4-dodecylphenylsulfonyl)oxime, 2,2,2-trifluoro-1-(4-thiomethylphenyl)ethanone O-(octylsulfonyl)oxime,
2,2,2-trifluoro-1-(4-thiomethylphenyl)ethanone O-(2-naphthylsulfonyl)oxime,
2,2,2-trifluoro-1-(2-methylphenyl)ethanone O-(methylsulfonyl)oxime,
2,2,2-trifluoro-1-(4-methylphenyl)ethanone O-(phenylsulfonyl)oxime,
2,2,2-trifluoro-1-(4-chlorophenyl)ethanone O-(phenylsulfonyl)oxime,
2,2,3,3,4,4,4-heptafluoro-1-phenylbutanone O-(10-camphorsulfonyl)oxime,
2,2,2-trifluoro-1-(1-naphthyl)ethanone O-(methylsulfonyl)oxime,
2,2,2-trifluoro-1-(2-naphthyl)ethanone O-(methylsulfonyl)oxime,
2,2,2-trifluoro-1-(4-benzylphenyl)ethanone O-(methylsulfonyl)oxime,
2,2,2-trifluoro-1-(4-(phenyl-1,4-dioxa-but-1-yl)phenyl)-ethanone O-(methylsulfonyl)oxime,
2,2,2-trifluoro-1-(1-naphthyl)ethanone O-(propylsulfonyl)oxime,
2,2,2-trifluoro-1-(2-naphthyl)ethanone O-(propylsulfonyl)oxime,
2,2,2-trifluoro-1-(4-benzylphenyl)ethanone O-(propylsulfonyl)oxime,
2,2,2-trifluoro-1-(4-methylsulfonylphenyl)ethanone O-(propylsulfonyl)oxime,
2,2,2-trifluoro-1-(4-methylsulfonyloxyphenyl)ethanone O-(propylsulfonyl)oxime,
2,2,2-trifluoro-1-(4-methylcarbonyloxyphenyl)ethanone O-(propylsulfonyl)oxime,
2,2,2-trifluoro-1-(6H,7H-5,8-dioxonaphth-2-yl)ethanone O-(propylsulfonyl)oxime,
2,2,2-trifluoro-1-(4-methoxycarbonylmethoxyphenyl)ethanone O-(propylsulfonyl)oxime,
2,2,2-trifluoro-1-(4-methoxycarbonyl)-(4-amino-1-oxa-pent-1-yl)phenyl)ethanone O-(propylsulfonyl)oxime,
2,2,2-trifluoro-1-(3,5-dimethyl-4-ethoxyphenyl)ethanone O-(propylsulfonyl)oxime,
2,2,2-trifluoro-1-(4-benzyloxyphenyl)ethanone O-(propylsulfonyl)oxime,
2,2,2-trifluoro-1-(2-thiophenyl)ethanone O-(propylsulfonate)oxime, and
2,2,2-trifluoro-1-(1-dioxathiophen-2-yl)ethanone O-(propylsulfonate)oxime;
2,2,2-trifluoro-1-(4-(3-(4-(2,2,2-trifluoro-1-(trifluoro-methanesulfonyloxyimino)ethyl)phenoxy)propoxy)phenyl)ethanone O-(trifluoromethanesulfonyl)oxime,
2,2,2-trifluoro-1-(4-(3-(4-(2,2,2-trifluoro-1-(1-propane-sulfonyloxyimino)ethyl)phenoxy)propoxy)phenyl)ethanone O-(propylsulfonyl)oxime,
2,2,2-trifluoro-1-(4-(3-(4-(2,2,2-trifluoro-1-(1-butane-sulfonyloxyimino)ethyl)phenoxy)propoxy)phenyl)ethanone O-(butylsulfonyl)oxime,
2,2,2-trifluoro-1-(4-(3-(4-(2,2,2-trifluoro-1-(4-(4-methylphenylsulfonyloxy)phenylsulfonyloxyimino)ethyl)phenoxy) propoxy)phenyl)ethanone O-(4-(4-methylphenylsulfonyloxy)-phenylsulfonyl)oxime, and 2,2,2-trifluoro-1-(4-(3-(4-(2,2,2-trifluoro-1-(2,5-bis(4-methylphenylsulfonyloxy)benzenesulfonyloxy)phenylsulfonyloxy-imino)ethyl)phenoxy)propoxy)phenyl)ethanone O-(2,5-bis(4-methylphenylsulfonyloxy)benzenesulfonyloxy)-phenylsulfonyl)oxime.

Also included are modified forms of the foregoing compounds having substituted on their skeleton
2-benzoyloxy-1,1,3,3,3-pentafluoropropanesulfonate,
1,1,3,3,3-pentafluoro-2-(4-phenylbenzoyloxy)propanesulfonate,
1,1,3,3,3-pentafluoro-2-pivaloyloxypropanesulfonate,
2-cyclohexanecarbonyloxy-1,1,3,3,3-pentafluoropropanesulfonate,
1,1,3,3,3-pentafluoro-2-furoyloxypropanesulfonate,
2-naphthoyloxy-1,1,3,3,3-pentafluoropropanesulfonate,
2-(4-t-butylbenzoyloxy)-1,1,3,3,3-pentafluoropropanesulfonate,
2-(1-adamantanecarbonyloxy)-1,1,3,3,3-pentafluoropropane-sulfonate,
2-acetyloxy-1,1,3,3,3-pentafluoropropanesulfonate,
1,1,3,3,3-pentafluoro-2-hydroxypropanesulfonate,
1,1,3,3,3-pentafluoro-2-tosyloxypropanesulfonate,
1,1-difluoro-2-tosyloxyethanesulfonate,
adamantanemethoxycarbonyldifluoromethanesulfonate,
1-(3-hydroxymethyladainantane)methoxycarbonyldifluoromethane-sulfonate,
methoxycarbonyldifluoromethanesulfonate,
1-(hexahydro-2-oxo-3,5-methano-2H-cyclopenta[b]furan-6-yl-oxycarbonyl)difluoromethanesulfonate, and
4-oxo-1-adamantyloxycarbonyldifluoromethanesulfonate.

Also included are oxime sulfonates having the formula (Ox-1):

(Ox-1)

wherein $R^{200}$ is a substituted or unsubstituted $C_1$-$C_{10}$ haloalkylsulfonyl or halobenzenesulfonyl group, $R^{201}$ is a $C_1$-$C_{11}$ haloalkyl group, and $R^{202}$ is substituted or unsubstituted aromatic or hetero-aromatic group.

Examples include
2-[2,2,3,3,4,4,5,5-octafluoro-1-(nonafluorobutylsulfonyloxyimino)pentyl]fluorene,
2-[2,2,3,3,4,4-pentafluoro-1-(nonafluorobutylsulfonyl-oxyimino)butyl]fluorene,
2-[2,2,3,3,4,4,5,5,6,6-decafluoro-1-(nonafluorobutylsulfonyl-oxylmino)hexyl]fluorene,
2-[2,2,3,3,4,4,5,5-octafluoro-1-(nonafluorobutylsulfonyloxyimino)pentyl]-4-biphenyl,
2-[2,2,3,3,4,4-pentafluoro-1-(nonafluorobutylsulfonyl-oxyimino)butyl]-4-biphenyl, and
2-[2,2,3,3,4,4,5,5,6,6-decafluoro-1-(nonafluorobutylsulfonyl-oxylmino)hexyl]-4-biphenyl.

Also included are modified forms of the foregoing compounds having substituted on their skeleton
2-benzoyloxy-1,1,3,3,3-pentafluoropropanesulfonate,
1,1,3,3,3-pentafluoro-2-(4-phenylbenzoyloxy)propanesulfonate,
1,1,3,3,3-pentafluoro-2-pivaloyloxypropanesulfonate,
2-cyclohexanecarbonyloxy-1,1,3,3,3-pentafluoropropanesulfonate,
1,1,3,3,3-pentafluoro-2-furoyloxypropanesulfonate,
2-naphthoyloxy-1,1,3,3,3-pentafluoropropanesulfonate,
2-(4-t-butylbenzoyloxy)-1,1,3,3,3-pentafluoropropanesulfonate,
2-(1-adamantanecarbonyloxy)-1,1,3,3,3-pentafluoro-propanesulfonate,
2-acetyloxy-1,1,3,3,3-pentafluoropropanesulfonate,
1,1,3,3,3-pentafluoro-2-hydroxypropanesulfonate,
1,1,3,3,3-pentafluoro-2-tosyloxypropanesulfonate,
1,1-difluoro-2-tosyloxyethanesulfonate,
adamantanemethoxycarbonyldifluoromethanesulfonate,
1-(3-hydroxymethyladamantane)methoxycarbonyldifluoromethane-sulfonate,
methoxycarbonyldifluoromethanesulfonate,
1-(hexahydro-2-oxo-3,5-methano-2H-cyclopenta[b]furan-6-yl-oxycarbonyl)difluoromethanesulfonate, and
4-oxo-1-adamantyloxycarbonyldifluoromethanesulfonate.

Suitable oxime sulfonate generators using substituted acetonitrile derivatives include
α-(p-toluenesulfonyloxylmino)-phenylacetonitrile,
α-(p-chlorobenzenesulfonyloxydmino)-phenylacetonitrile,
α-(4-nitrobenzenesulfonyloxyimino)-phenylacetonitrile,
α-(4-nitro-2-trifluoromethylbenzenesulfonyloxyimino)-phenylacetonitrile,
α-(benzenesulfonyloxydmino)-4-chlorophenylacetonitrile,
α-(benzenesulfonyloxyimino)-2,4-dichlorophenylacetonitrile,
α-(benzenesulfonyloxylmino)-2,6-dichlorophenylacetonitrile,
α-(benzenesulfonyloxyimino)-4-methoxyphenylacetonitrile,
α-(2-chlorobenzenesulfonyloxyimino)-4-methoxyphenylacetonitrile,
α-(benzenesulfonyloxylmino)-2-thienylacetonitrile,
α-(4-dodecylbenzenesulfonyloxyimino)-phenylacetonitrile,
α-[(4-toluenesulfonyloxyimino)-4-methoxyphenyl]acetonitrile,
α-[(dodecylbenzenesulfonyloxyimino)-4-methoxyphenyl]-acetonitrile,
α-(tosyloxylmino)-3-thienylacetonitrile,
α-(methylsulfonyloxylmino)-1-cyclopentenylacetonitrile,
α-(ethylsulfonyloxyimino)-1-cyclopentenylacetonitrile,
α-(isopropylsulfonyloxylmino)-1-cyclopentenylacetonitrile,
α-(n-butylsulfonyloxylmino)-1-cyclopentenylacetonitrile,
α-(ethylsulfonyloxyimino)-1-cyclohexenylacetonitrile,
α-(isopropylsulfonyloxyimino)-1-cyclohexenylacetonitrile, and
α-(n-butylsulfonyloxyimino)-1-cyclohexenylacetonitrile.

Also included are modified forms of the foregoing compounds having substituted on their skeleton
2-benzoyloxy-1,1,3,3,3-pentafluoropropanesulfonate,
1,1,3,3,3-pentafluoro-2-(4-phenylbenzoyloxy)propanesulfonate,
1,1,3,3,3-pentafluoro-2-pivaloyloxypropanesulfonate,
2-cyclohexanecarbonyloxy-1,1,3,3,3-pentafluoropropanesulfonate,
1,1,3,3,3-pentafluoro-2-furoyloxypropanesulfonate,
2-naphthoyloxy-1,1,3,3,3-pentafluoropropanesulfonate,
2-(4-t-butylbenzoyloxy)-1,1,3,3,3-pentafluoropropanesulfonate,
2-(1-adamantanecarbonyloxy)-1,1,3,3,3-pentafluoropropane-sulfonate,
2-acetyloxy-1,1,3,3,3-pentafluoropropanesulfonate,
1,1,3,3,3-pentafluoro-2-hydroxypropanesulfonate,
1,1,3,3,3-pentafluoro-2-tosyloxypropanesulfonate,
1,1-difluoro-2-tosyloxyethanesulfonate,
adamantanemethoxycarbonyldifluoromethanesulfonate, 1-(3-hydroxymethyladamantane)methoxycarbonyldifluo-
romethane-sulfonate,
methoxycarbonyldifluoromethanesulfonate,
1-(hexahydro-2-oxo-3,5-methano-2H-cyclopenta[b]furan-
6-yl-oxycarbonyl)difluoromethanesulfonate, and
4-oxo-1-adamantyloxycarbonyldifluoromethanesulfonate.
Suitable bisoxime sulfonates include
bis($\alpha$-(p-toluenesulfonyloxy)imino)-p-phenylenediacetoni-
trile,
bis($\alpha$-(benzenesulfonyloxy)imino)-p-phenylenediacetoni-
trile,
bis($\alpha$-(methanesulfonyloxy)imino)-p-phenylenediacetoni-
trile,
bis($\alpha$-(butanesulfonyloxy)imino)-p-phenylenediacetoni-
trile,
bis($\alpha$-(10-camphorsulfonyloxy)imino)-p-phenylenediac-
etonitrile,
bis(a$\alpha$-(trifluoromethanesulfonyloxy)imino)-p-phenylene-
diacetonitrile,
bis($\alpha$-(4-methoxybenzenesulfonyloxy)imino)-p-phenylene-
diacetonitrile,
bis($\alpha$-(p-toluenesulfonyloxy)imino)-m-phenylenediacetoni-
trile,
bis($\alpha$-(benzenesulfonyloxy)imino)-m-phenylenediacetoni-
trile,
bis($\alpha$-(methanesulfonyloxy)imino)-m-phenylenediacetoni-
trile,
bis($\alpha$-(butanesulfonyloxy)imino)-m-phenylenediacetoni-
trile,
bis($\alpha$-(10-camphorsulfonyloxy)imino)-m-phenylenediac-
etonitrile,
bis($\alpha$-(trifluoromethanesulfonyloxy)imino)-m-phenylene-
diacetonitrile,
bis($\alpha$-(4-methoxybenzenesulfonyloxy)imino)-m-phe-
nylene-diacetonitrile, etc.
Also included are modified forms of the foregoing com-
pounds having substituted on their skeleton
2-benzoyloxy-1,1,3,3,3-pentafluoropropanesulfonate,
1,1,3,3,3-pentafluoro-2-(4-phenylbenzoyloxy)propanesul-
fonate,
1,1,3,3,3-pentafluoro-2-pivaloyloxypropanesulfonate,
2-cyclohexanecarbonyloxy-1,1,3,3,3-pentafluoropropane-
sulfonate,
1,1,3,3,3-pentafluoro-2-furoyloxypropanesulfonate,
2-naphthoyloxy-1,1,3,3,3-pentafluoropropanesulfonate,
2-(4-t-butylbenzoyloxy)-1,1,3,3,3-pentafluoropropanesul-
fonate,
2-(1-adamantanecarbonyloxy)-1,1,3,3,3-pentafluoropro-
pane-sulfonate,
2-acetyloxy-1,1,3,3,3-pentafluoropropanesulfonate,
1,1,3,3,3-pentafluoro-2-hydroxypropanesulfonate,
1,1,3,3,3-pentafluoro-2-tosyloxypropanesulfonate,
1,1-difluoro-2-tosyloxyethanesulfonate,
adamantanemethoxycarbonyldifluoromethanesulfonate,
1-(3-hydroxymethyladamantane)methoxycarbonyldifluo-
romethane-sulfonate, methoxycarbonyldifluoromethane-
sulfonate,
1-(hexahydro-2-oxo-3,5-methano-2H-cyclopenta[b]furan-
6-yl-oxycarbonyl)difluoromethanesulfonate, and
4-oxo-1-adamantyloxycarbonyldifluoromethanesulfonate.

Among these, the preferred PAGs are sulfonium salts, bissulfonyldiazomethanes, N-sulfonyloxyimides, and sulfonyloxime compounds.

Although the optimum anion of the generated acid varies with such factors as ease of scission of the acid labile group in the polymer, an anion which is non-volatile and not extremely highly diffusive is generally selected. Appropriate anions include anions of benzenesulfonic acid,
toluenesulfonic acid,
4-(4-toluenesulfonyloxy)benzenesulfonic acid,
pentafluorobenzenesulfonic acid,
2,2,2-trifluoroethanesulfonic acid,
nonafluorobutanesulfonic acid,
heptadecafluorooctanesulfonic acid, and camphorsulfonic acid.

The PAG (C) is added to the chemically amplified positive resist composition in an amount of 0.2 to 20 parts, preferably 0.5 to 10 parts by weight per 100 parts by weight of the polymer (A). The PAG may be used alone or in admixture of two or more. The transmittance of the resist film can be controlled by using a PAG having a low transmittance at the exposure wavelength and adjusting the amount of the PAG added. If the amount of the PAG is too small, the desired sensitivity may not be obtained. If the amount of the PAG is too large, it is difficult to form a pattern of the desired size in a consistent manner.

Component (D) is an organic solvent which is used in the resist composition in order that various components be uniformly dissolved and mixed therein. Suitable solvents include, but are not limited to, butyl acetate, pentyl acetate, cyclohexyl acetate, 3-methoxybutyl acetate, methyl ethyl ketone, methyl pentyl ketone, cyclohexanone, cyclopentanone, 3-ethoxyethyl propionate, 3-ethoxymethyl lo propionate, 3-methoxymethyl propionate, methyl acetoacetate, ethyl acetoacetate, diacetone alcohol, methyl pyruvate, ethyl pyruvate, propylene glycol monomethyl ether, propylene glycol monoethyl ether, propylene glycol monomethyl ether propionate, propylene glycol monoethyl ether propionate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethyl sulfoxide, y-butyrolactone, propylene glycol methyl ether acetate (PGMEA), propylene glycol ethyl ether acetate, propylene glycol propyl ether acetate, methyl lactate, ethyl lactate, propyl lactate, and tetramethylene sulfone. Inter alia, propylene glycol alkyl ether acetates and alkyl lactates are preferred. The solvents may be used alone or in admixture. The preferred solvent mixture is a combination of a propylene glycol alkyl ether acetate and an alkyl lactate. It is noted that the alkyl group of the propylene glycol alkyl ether acetate is preferably of 1 to 4 carbon atoms, for example, methyl, ethyl and propyl, with methyl and ethyl being especially preferred. Since the propylene glycol alkyl ether acetates include 1,2- and 1,3-substituted ones, each includes three isomers depending on the combination of substituted positions, which may be used alone or in admixture. It is also noted that the alkyl group of the alkyl lactate is preferably of 1 to 4 carbon atoms, for example, methyl, ethyl and propyl, with methyl and ethyl being especially preferred.

In the resist composition, the solvent is preferably used in an amount of 50 to 2,000 parts by weight, especially 100 to 1,000 parts by weight per 100 parts by weight of the polymer of formula (1). The amount of the solvent is not limited thereto as long as the components can be dissolved and mixed uniformly and a coating of predetermined thickness be formed. The resulting solution may be filtered through a filter, if necessary.

To the resist composition, (E) a surfactant may be added if desired. Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, and polyether silicones; fluorochemical surfactants such as EFTOP EF301, EF303 and EF352 (Tohkem Products Co., Ltd.), Megaface F171, F172 and F173 (DIC Corp.), Fluorad FC-4430, FC-430 and FC-431 (Sumitomo 3M Co., Ltd.), Surfynol E1004 (Nissin Chemical Industry Co., Ltd.), Asahiguard AG710, Surflon S-381, S-382, SC101, SC102, SC103, SC104, SC105, SC106, KH-10, KH-20, KH-30 and KH-40 (AGC Seimi Chemical Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). Inter alia, FC-430 and X-70-093 are preferred. These surfactants may be used alone or in admixture.

In the resist composition, the surfactant is formulated in an amount of up to 5 parts, and preferably up to 2 parts by weight per 100 parts by weight of the polymer of formula (1).

To the resist composition, (F) a basic compound may be formulated, if desired. The basic compound (F) is preferably a compound capable of suppressing the rate of diffusion when the acid generated by the PAG diffuses within the resist film. The inclusion of this type of basic compound holds down the rate of acid diffusion within the resist film, resulting in better resolution. In addition, it suppresses changes in sensitivity following exposure and reduces substrate and environment dependence, as well as improving the exposure latitude and the pattern profile.

Examples of the basic compound (F) include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, and imide derivatives.

Examples of suitable primary aliphatic amines include ammonia, methylamine, ethylamine, n-propylamine, isopropylamine, n-butylamine, isobutylamine, sec-butylamine, t-butylamine, pentylamine, t-pentylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazole derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-t-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (F-1) may also be added alone or in admixture.

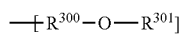  (F-1)

In formula (F-1), c is equal to 1, 2 or 3; side chain V is independently hydrogen or a straight, branched or cyclic $C_1$-$C_{20}$ alkyl group which may contain a hydroxyl or ether moiety; and side chain X is independently selected from groups of the following general formulas (F-2) to (F-4), and two or three X may bond together to form a ring with the nitrogen atom to which they are attached.

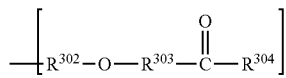

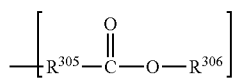

In the formulas, $R^{300}$, $R^{302}$ and $R^{305}$ are independently a straight or branched $C_1$-$C_4$ alkylene group. $R^{301}$ and $R^{304}$ are independently hydrogen, or a straight, branched or cyclic $C_1$-$C_{20}$ alkyl group which may contain at least one hydroxyl, ether or ester moiety or lactone ring. $R^{303}$ is a single bond or a straight or branched $C_1$-$C_4$ alkylene group. $R^{306}$ is a straight, branched or cyclic $C_1$-$C_{20}$ alkyl group which may contain at least one hydroxyl, ether or ester moiety or lactone ring.

Illustrative examples of the basic compounds of formula (F-1) include tris(2-methoxymethoxyethyl)amine, tris{2-(2-methoxyethoxy)ethyl}amine,
tris{2-(2-methoxyethoxymethoxy)ethyl}amine,
tris{2-(1-methoxyethoxy)ethyl}amine,
tris{2-(1-ethoxyethoxy)ethyl}amine,
tris{2-(1-ethoxypropoxy)ethyl}amine,
tris[2-{2-(2-hydroxyethoxy)ethoxy}ethyl]amine,
4,7,13,16,21,24-hexaoxa-1,10-diazabicyclo[8.8.8]hexacosane,
4,7,13,18-tetraoxa-1,10-diazabicyclo[8.5.5]eicosane,
1,4,10,13-tetraoxa-7,16-diazabicyclooctadecane,
1-aza-12-crown-4, 1-aza-15-crown-5, 1-aza-18-crown-6,
tris(2-formyloxyethyl)amine, tris(2-acetoxyethyl)amine,
tris(2-propionyloxyethyl)amine, tris(2-butyryloxyethyl)amine,
tris(2-isobutyryloxyethyl)amine, tris(2-valeryloxyethyl)amine,
tris(2-pivaloyloxyethyl)amine,
N,N-bis(2-acetoxyethyl)-2-(acetoxyacetoxy)ethylamine,
tris(2-methoxycarbonyloxyethyl)amine,
tris(2-t-butoxycarbonyloxyethyl)amine,
tris[2-(2-oxopropoxy)ethyl]amine,
tris[2-(methoxycarbonylmethyl)oxyethyl]amine,
tris[2-(t-butoxycarbonylmethyloxy)ethyl]amine,
tris[2-(cyclohexyloxycarbonylmethyloxy)ethyl]amine,
tris(2-methoxycarbonylethyl)amine,
tris(2-ethoxycarbonylethyl)amine,
N,N-bis(2-hydroxyethyl)-2-(methoxycarbonyl)ethylamine,
N,N-bis(2-acetoxyethyl)-2-(methoxycarbonyl)ethylamine,
N,N-bis(2-hydroxyethyl)-2-(ethoxycarbonyl)ethylamine,
N,N-bis(2-acetoxyethyl)-2-(ethoxycarbonyl)ethylamine,
N,N-bis(2-hydroxyethyl)-2-(2-methoxyethoxycarbonyl)ethylamine,
N,N-bis(2-acetoxyethyl)-2-(2-methoxyethoxycarbonyl)ethylamine,
N,N-bis(2-hydroxyethyl)-2-(2-hydroxyethoxycarbonyl)ethylamine,
N,N-bis(2-acetoxyethyl)-2-(2-acetoxyethoxycarbonyl)ethylamine,
N,N-bis(2-hydroxyethyl)-2-[(methoxycarbonyl)methoxycarbonyl]-ethylamine,
N,N-bis(2-acetoxyethyl)-2-[(methoxycarbonyl)methoxycarbonyl]-ethylamine,
N,N-bis(2-hydroxyethyl)-2-(2-oxopropoxycarbonyl)ethylamine,
N,N-bis(2-acetoxyethyl)-2-(2-oxopropoxycarbonyl)ethylamine,
N,N-bis(2-hydroxyethyl)-2-(tetrahydrofurfuryloxycarbonyl)-ethylamine,
N,N-bis(2-acetoxyethyl)-2-(tetrahydrofurfuryloxycarbonyl)-ethylamine,
N,N-bis(2-hydroxyethyl)-2-[(2-oxotetrahydrofuran-3-yl)oxy-carbonyl]ethylamine,
N,N-bis(2-acetoxyethyl)-2-[(2-oxotetrahydrofuran-3-yl)oxy-carbonyl]ethylamine,
N,N-bis(2-hydroxyethyl)-2-(4-hydroxybutoxycarbonyl)ethylamine,
N,N-bis(2-formyloxyethyl)-2-(4-formyloxybutoxycarbonyl)-ethylamine,
N,N-bis(2-formyloxyethyl)-2-(2-formyloxyethoxycarbonyl)-ethylamine,
N,N-bis(2-methoxyethyl)-2-(methoxycarbonyl)ethylamine,
N-(2-hydroxyethyl)-bis[2-(methoxycarbonyl)ethyl]amine,
N-(2-acetoxyethyl)-bis[2-(methoxycarbonyl)ethyl]amine,
N-(2-hydroxyethyl)-bis[2-(ethoxycarbonyl)ethyl]amine,
N-(2-acetoxyethyl)-bis[2-(ethoxycarbonyl)ethyl]amine,
N-(3-hydroxy-1-propyl)-bis[2-(methoxycarbonyl)ethyl]amine,
N-(3-acetoxy-1-propyl)-bis[2-(methoxycarbonyl)ethyl]amine,
N-(2-methoxyethyl)-bis[2-(methoxycarbonyl)ethyl]amine,
N-butyl-bis[2-(methoxycarbonyl)ethyl]amine,
N-butyl-bis[2-(2-methoxyethoxycarbonyl)ethyl]amine,
N-methyl-bis(2-acetoxyethyl)amine,
N-ethyl-bis(2-acetoxyethyl)amine,
N-methyl-bis(2-pivaloyloxyethyl)amine,
N-ethyl-bis[2-(methoxycarbonyloxy)ethyl]amine,
N-ethyl-bis[2-(t-butoxycarbonyloxy)ethyl]amine,
tris(methoxycarbonylmethyl)amine,
tris(ethoxycarbonylmethyl)amine,
N-butyl-bis(methoxycarbonylmethyl)amine,
N-hexyl-bis(methoxycarbonylmethyl)amine, and
β-(diethylamino)-δ-valerolactone.

The basic compounds may be used alone or in admixture of two or more. The basic compound (F) is preferably formulated in an amount of 0 to 2 parts, and especially 0.01 to 1 part by weight per 100 parts by weight of the polymer (A). More than 2 parts of the basic compound may result in too low a sensitivity.

In the resist composition, other optional components may be added, for example, a light absorbing substance for reducing diffuse reflection from the substrate, a compound having 1,2-naphthoquinonediazidesulfonyl group in the molecule, sensitizer, crosslinker, photobase generator and acid amplifier. Such optional components may be added in conventional amounts as long as they do not compromise the benefits of the invention.

Suitable light absorbing substances include azo compounds such as 2-benzeneazo-4-methylphenol and 4-hydroxy-4'-dimethylaminoazobenzene, and curcumin.

Process

The positive resist composition of the invention may be used to form a pattern by any well-known lithography processes. For example, the resist composition is applied onto a substrate by suitable coating techniques such as spin coating, roll coating, flow coating, dip coating, spray coating, and doctor blade coating. Suitable substrates include substrates of Si, $SiO_2$, SiN, SiON, TiN, WSi, BPSG and SOG, metal substrates of Au, Ti, W, Cu, Ni-Fe, Ta, Zn, Co and Pb, and organic antireflective coatings. The coating is prebaked on a hot plate at 60 to 150° C. for 0.5 to 10 minutes, preferably at 80 to 120° C. for 1 to 5 minutes to form a resist film having a desired thickness. Through a mask having a desired pattern, the resist film is then exposed to radiation having a wavelength of at least 300 nm, especially 300 to 500 nm, such as UV, deep UV and EB. The exposure dose is preferably in the range of about 1 to 1,000 $mJ/cm^2$, more preferably about 10 to 800 $mJ/cm^2$. If desired, the film may be baked (PEB) on a hot plate at 60 to 150° C. for 1 to 5 minutes, preferably 80 to 120° C. for 1 to 3 minutes.

Thereafter the resist film is developed in a developer in the form of an aqueous alkaline solution, for example, 0.1 to 5 wt %, preferably 2 to 3 wt % aqueous solution of TMAH for 0.1 to 60 minutes, preferably 0.5 to 10 minutes by conventional techniques such as dip, puddle or spray development. In this way, a desired resist pattern is formed on the substrate.

EXAMPLE

Examples of the invention are given below by way of illustration and not by way of limitation. All parts are by weight (pbw).

Examples 1 to 10 & Comparative Examples 1 to 5

First, the dissolution rate of an alkali-soluble polymer (B) as shown in Table 1 was determined. Specifically, the dissolution rate of a polymer was determined by dissolving the polymer in propylene glycol monomethyl ether acetate (PGMEA), passing the solution through a membrane filter having a pore size of 0.5 μm, and applying the solution onto a Si substrate with diameter 200 mm by means of a spin coater. The thickness of the coating was measured by an optical interference film thickness gauge. The coating was developed in an alkaline developer, 2.38 wt % TMAH aqueous solution for 10 seconds, after which the thickness of the residual coating was measured by the same gauge. From the difference in thickness before and after development, a dissolution rate was computed.

TABLE 1

| Alkali-soluble polymer | | Mw | Alkaline dissolution rate (Å/sec) |
|---|---|---|---|
| AP-1 | UH-2000 | 11,000 | 3,500 |
| AP-2 | UC-3510 | 2,000 | 11,000 |

TABLE 1-continued

| Alkali-soluble polymer | | Mw | Alkaline dissolution rate (Å/sec) |
|---|---|---|---|
| AP-3 | Maruka Lyncur M S-1P | 1,500 | 14,500 |
| AP-4 | Acrit 8KQ-2001 | 20,000 | 18,000 |
| AP-5 | EP6050G | 3,200 | 520 |
| AP-6 | EP4080G | 5,200 | 800 |

Note:

UH-2000: hydroxyl-containing acrylic polymer, Toa Gosei Co., Ltd.

UC-3510: carboxyl-containing acrylic polymer, Toa Gosei Co., Ltd.

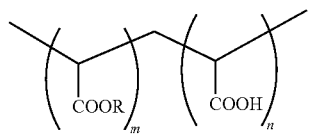

Maruka Lyncur M S-1P:

poly(p-vinylphenol),

Maruzene Petrochemical Co., Ltd.

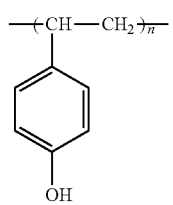

Acrit 8KQ-2001:

acryloyl and carboxyl-containing urethane acrylate polymer, Taisei Fine Chemical Co., Ltd.

EP6050G: cresol novolak resin (m-cresol/p-cresol=40/60), Asahi Yukizai Corp.

EP4080G: cresol novolak resin (m-cresol/p-cresol=60/40), Asahi Yukizai Corp.

A resist solution was prepared by dissolving 100 parts of a base resin having recurring units shown below (Polymer-1, 2), an amount (shown in Table 3) of an alkali-soluble polymer (AP-1 to AP-6 listed in Table 1), 2.0 parts of a photoacid generator PAI-101 (Midori Chemical Co., Ltd.), 0.1 part of a basic compound (Amine-1), and 0.10 part of surfactant X-70-093 (Shin-Etsu Chemical Co., Ltd.) in 100 parts of a solvent mixture of PGMEA and cyclopentanone in a weight ratio of 1:1, and passing through a membrane filter with a pore size of 1.0 μm. The resist solution was spin coated onto a silicon substrate of diameter 200 mm and soft-baked on a hot plate at 120° C. for 120 seconds to form a resist film of 10 μm thick.

The resist film was exposed through a reticle using an i-line stepper NSR-2205i11D (Nikon Corp.), baked (PEB) at 110° C. for 90 seconds, and puddle developed in 2.38 wt % TMAH aqueous solution for 60 seconds. This was followed by deionized water rinsing and drying, yielding a resist pattern.

Polymer-1

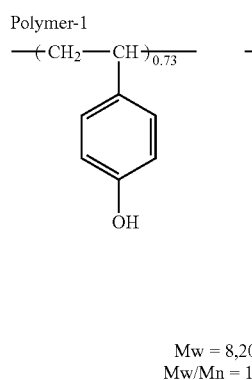

Mw = 8,200
Mw/Mn = 1.60

Polymer-2

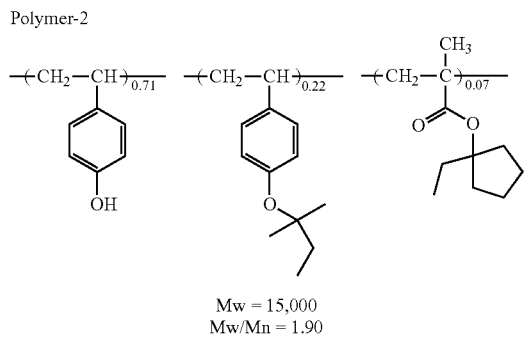

Mw = 15,000
Mw/Mn = 1.90

Photoacid generator PAI-101: sulfonic acid ester

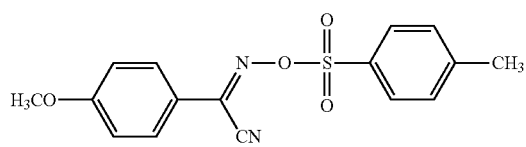

Amine-1

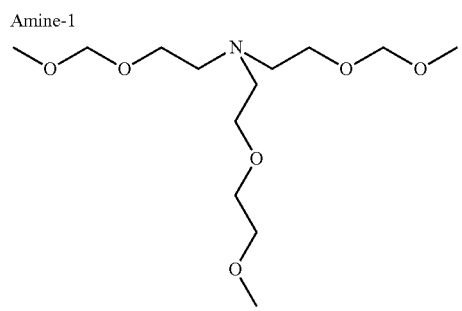

TABLE 2

|  |  | Base resin | Alkali-soluble polymer (pbw) |
|---|---|---|---|
| Example | 1 | Polymer-1 | AP-1(15) |
|  | 2 | Polymer-1 | AP-1(20) |
|  | 3 | Polymer-1 | AP-2(5) |
|  | 4 | Polymer-1 | AP-5(15) |
|  | 5 | Polymer-1 | AP-6(20) |
|  | 6 | Polymer-2 | AP-1(15) |
|  | 7 | Polymer-2 | AP-2(10) |
|  | 8 | Polymer-2 | AP-2(15) |
|  | 9 | Polymer-2 | AP-5(10) |
|  | 10 | Polymer-2 | AP-6(15) |

TABLE 2-continued

|  |  | Base resin | Alkali-soluble polymer (pbw) |
|---|---|---|---|
| Comparative Example | 1 | Polymer-1 | nil |
|  | 2 | Polymer-1 | AP-3(10) |
|  | 3 | Polymer-2 | nil |
|  | 4 | Polymer-2 | AP-4(10) |
|  | 5 | Polymer-2 | AP-3(20) |

The pattern was observed under a scanning electron microscope S-4700 (Hitachi High Technologies Ltd.) to examine an optimum exposure dose and pattern sidewall profile. The optimum exposure dose is a dose that provides a 1:1 resolution to a pattern of repeating lines and spaces of 10 μm. The results are shown in Table 3.

TABLE 3

|  |  | Optimum dose (mJ/cm$^2$) | Sidewall profile |
|---|---|---|---|
| Example | 1 | 220 | rectangular, no dimples |
|  | 2 | 180 | rectangular, no dimples |
|  | 3 | 170 | rectangular, no dimples |
|  | 4 | 580 | rectangular, no dimples |
|  | 5 | 450 | rectangular, no dimples |
|  | 6 | 80 | rectangular, no dimples |
|  | 7 | 60 | rectangular, no dimples |
|  | 8 | 50 | rectangular, no dimples |
|  | 9 | 230 | rectangular, no dimples |
|  | 10 | 170 | rectangular, no dimples |
| Comparative Example | 1 | unresolved | — |
|  | 2 | 70 | rectangular, dimples |
|  | 3 | unresolved | — |
|  | 4 | 35 | undercut, dimples |
|  | 5 | 45 | rectangular, dimples |

Japanese Patent Application No. 2015-210328 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified positive resist composition comprising (A) a polymer adapted to turn soluble in alkaline aqueous solution under the action of acid, comprising recurring units having the general formula (1), and having a weight average molecular weight of 1,000 to 500,000,

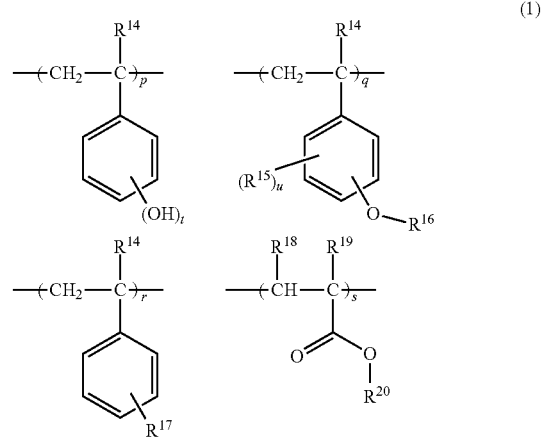

(1)

wherein $R^{14}$ is hydrogen, hydroxyl, straight alkyl, branched alkyl, halogen, or trifluoromethyl, $R^{15}$ is hydrogen, hydroxyl, halogen or trifluoromethyl, $R^{16}$ is $C_4$-$C_{12}$ tertiary alkyl, $R^{17}$ is hydrogen, optionally substituted alkyl, optionally substituted alkoxy, —$C(CF_3)_2$—OH, trialkylsilyl in which each alkyl moiety has 1 to 6 carbon atoms, $C_4$-$C_{20}$ oxoalkoxy, tetrahydropyranyloxy, tetrahydrofuranyloxy, or trialkylsilyl, $R^{18}$ is hydrogen or methyl, $R^{19}$ is hydrogen, methyl, alkoxycarbonyl, cyano, halogen, or trifluoromethyl, $R^{20}$ is a $C_4$-$C_{30}$ substituted or unsubstituted, straight or branched alkyl group or substituted or unsubstituted cycloalkyl group, u is 0 or an integer of 1 to 4, t is 0 or an integer of 1 to 5, p, r and s are 0 or positive numbers, q is a positive number, p+q+r+s=1, (B) an alkali-soluble polymer containing a hydroxyl and/or carboxyl group and having a weight average molecular weight of 1,000 to 100,000, the polymer being soluble in an alkaline aqueous solution and having an alkaline dissolution rate of 400 to 12,000 Å/sec in 2.38 wt % tetramethylammonium hydroxide aqueous solution, (C) a photoacid generator, and (D) an organic solvent, wherein the alkali-soluble polymer (B) is selected from the group consisting of phenolic resin, urethane resin, polyhydroxystyrene, a polymer obtained from copolymerization of hydroxystyrene with a carbonyl-containing vinyl monomer, a polymer obtained from polymerization or copolymerization of a carboxyl-containing monomer selected from the group consisting of acrylic acid, methacrylic acid, (meth)acrylate and maleic acid, a polymer obtained from copolymerization of hydroxystyrene with a carboxyl-containing monomer, and an alkali-soluble cellulose, and an amount of the alkali-souluble polymer is 3 to 35 parts by weight per 100 parts by weight of the polymer of formula (1).

2. The resist composition of claim 1 wherein in formula (1), p and q are in the range: 0.3≤p/(p+q+r+s)≤0.8 and 0≤q/(p+q+r+s)≤0.5.

3. The resist composition of claim 1 wherein in formula (1), p, q and s are in the range: 0.3≤p/(p+q+r+s)≤0.8, 0≤q/(p+q+r+s)≤0.5, and 0≤s/((p+q+r+s)≤0.3.

4. The resist composition of claim 3 wherein in formula (1), $R^{20}$ is a group selected from the following formulae (4), (5), (6'), (6''), (6''') and (6''''):

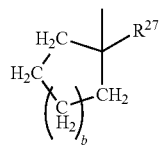

(4)

wherein $R^{27}$ is methyl, ethyl, isopropyl, cyclohexyl, cyclopentyl, vinyl, acetyl, phenyl, benzyl or cyano, b is an integer of 0 to 3,

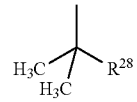

(5)

wherein $R^{28}$ is methyl, ethyl, isopropyl, cyclohexyl, cyclopentyl, vinyl, phenyl, benzyl or cyano,

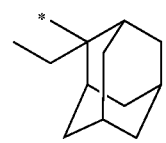

(6')

(6'')

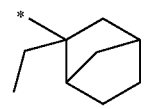

(6''')

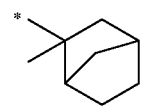

(6'''')

wherein * denotes a valence bond.

5. A pattern forming process comprising the steps of:

(i) coating the chemically amplified positive resist composition of claim 1 onto a substrate and prebaking to form a resist film, (ii) exposing the resist film to UV radiation having a wavelength, of at least 300 nm, and (iii) optionally baking, and developing the resist film in an alkaline aqueous solution.

6. The resist composition of claim 1, wherein the alkali soluble polymer (B) is selected from the group consisting of phenolic resin, urethane resin, a homopolymer or copolymer of a carboxyl-containing monomer, and an alkali-soluble cellulose.

7. The resist composition of claim 1, wherein the alkali-soluble polymer (B) is used in an amount of 3 to 35 parts by weight per 100 parts by weight of the polymer (A).

8. The resist composition of claim 1, wherein PAG (C) is used in am amount of 0.2 to 20 parts by weight per 100 parts by weight of the polymer (A).

* * * * *